US009052350B2

(12) United States Patent
Neti et al.

(10) Patent No.: US 9,052,350 B2
(45) Date of Patent: Jun. 9, 2015

(54) ON-LINE MONITORING SYSTEM FOR USE WITH ELECTRICAL ASSETS AND METHOD OF OPERATING THE SAME

(75) Inventors: Prabhakar Neti, Rexford, NY (US); Pinjia Zhang, Clifton Park, NY (US); Manoj Ramprasad Shah, Latham, NY (US)

(73) Assignee: General Electric Company, Niskayuna, NY (US)

( * ) Notice: Subject to any disclaimer, the term of this patent is extended or adjusted under 35 U.S.C. 154(b) by 297 days.

(21) Appl. No.: 13/562,514

(22) Filed: Jul. 31, 2012

(65) Prior Publication Data
US 2014/0035595 A1    Feb. 6, 2014

(51) Int. Cl.
*G01R 31/14*     (2006.01)
*G01R 31/02*     (2006.01)
*G01F 11/00*     (2006.01)
*G01F 1/00*      (2006.01)
*G01R 31/34*     (2006.01)
*G01F 17/00*     (2006.01)

(52) U.S. Cl.
CPC .............. *G01R 31/027* (2013.01); *G01F 11/00* (2013.01); *G01F 1/00* (2013.01); *G01F 17/00* (2013.01); *G01R 31/343* (2013.01); *G01R 31/021* (2013.01)

(58) Field of Classification Search
CPC ........... G01F 1/00; G01F 11/00; G01F 17/00; G01F 23/00
USPC ....................................................... 324/511
See application file for complete search history.

(56) References Cited

U.S. PATENT DOCUMENTS

| 5,485,491 | A | 1/1996 | Salnick et al. |
| 6,035,265 | A | 3/2000 | Dister et al. |
| 6,323,658 | B1 | 11/2001 | Kendig et al. |
| 6,483,319 | B1 | 11/2002 | Kendig et al. |
| 6,952,159 | B1 * | 10/2005 | Muller ............................ 375/257 |
| 7,702,435 | B2 * | 4/2010 | Pereira et al. ................ 701/30.8 |

(Continued)

FOREIGN PATENT DOCUMENTS

| JP | 06313780 | 8/1994 |
| WO | 2010069739 A1 | 6/2010 |

OTHER PUBLICATIONS

Briz et al. ("Online stator winding fault diagnosis in inverter-fed AC machines using high-frequency signal injection," IEEE Transactions on Industry Applications Conference, Jul./Aug. 2003, pp. 1109-1117, vol. 39, No. 4.).*

*Primary Examiner* — Huy Q Phan
*Assistant Examiner* — Temilade S Rhodes-Vivour
(74) *Attorney, Agent, or Firm* — Jason K. Klindtworth

(57) ABSTRACT

A system configured to monitor an operating electrical device includes a testing channel coupled to the device. The device is coupled to an electric power source through at least one electric power transmission channel. The power source is configured to transmit electric power at a first frequency. The testing channel is coupled to the power transmission channel. The system also includes a signal generator coupled to the testing channel. The signal generator is configured to inject testing signals into the testing channel at a second frequency that is greater than the first frequency. The system further includes at least one apparatus magnetically coupled to the power transmission channel. The magnetically coupled apparatus is configured to present a first impedance to the electric power at the first frequency and present a second impedance to the test signals at the second frequency. The second impedance is greater than the first impedance.

19 Claims, 4 Drawing Sheets

(56) References Cited

U.S. PATENT DOCUMENTS

| | | |
|---|---|---|
| 8,054,084 B2 | 11/2011 | Schulz et al. |
| 2004/0246108 A1* | 12/2004 | Robertson et al. ....... 340/310.01 |
| 2006/0232348 A1* | 10/2006 | Hino ............................ 331/167 |
| 2007/0052397 A1* | 3/2007 | Thompson et al. ........... 323/223 |
| 2009/0051308 A1* | 2/2009 | Lu et al. ........................ 318/490 |
| 2010/0114530 A1* | 5/2010 | Gaiser et al. ................. 702/183 |
| 2011/0006755 A1 | 1/2011 | Younsi et al. |
| 2011/0006802 A1 | 1/2011 | Younsi et al. |
| 2011/0041590 A1* | 2/2011 | Oddie et al. ................. 73/64.53 |

* cited by examiner

ON-LINE MONITORING SYSTEM FOR USE WITH ELECTRICAL ASSETS AND METHOD OF OPERATING THE SAME

BACKGROUND

The subject matter disclosed herein relates generally to electrical equipment and, more particularly, to signal injection systems that facilitate monitoring of electrical equipment while the equipment is in service.

Many known pieces of electrical equipment are placed in service for extended periods of time. Such known electrical equipment includes motors, generators, transformers, and power cables. These extended operational periods may last for weeks and months and removing such equipment from on-line service merely to perform preventative maintenance checks may be impractical. However, regardless of the operating condition of the electrical equipment, routine preventative maintenance and operational checks of portions of the equipment need to be performed. Such preventative maintenance and operational checks include measuring values of monitored components such as a resistance provided by insulating materials associated with the electrical devices, for example, insulation between motor/generator/transformer windings and proximate components at ground potential.

At least some known extended-use electrical equipment includes monitoring systems that transmit high-frequency and low-voltage signals into the on-line electrical equipment to measure the properties of the monitored components. However, due to the low impedance of the power transmission portion of the electrical equipment, and the high impedance of the monitored components, a significant portion of the signals is transmitted through the power transmission portions and only a small fraction of the signals are transmitted to the monitored components. Therefore, the low signal strength transmitted to the monitored components increases the ambiguity of the measured values and, therefore, reduces the reliability of those values. Adding high-inductance components in direct contact with the power transmission portions is expensive in that the additional components need to be rated for extended exposure to the line currents of the equipment. Moreover, at least some known electrical equipment does not have a component configuration that defines sufficient unused space for such high-inductance components.

BRIEF DESCRIPTION

In one aspect, a system configured to monitor an operating electrical device is provided. The operating electrical device is coupled to an electric power source through at least one electric power transmission channel. The electric power source is configured to transmit electric power at a first frequency and a first voltage. The operating electrical device includes at least a portion to be tested. The system includes a testing channel configured to be coupled to the portion of the operating electrical device to be tested and the at least one electric power transmission channel. The system also includes a signal generator coupled to the testing channel. The signal generator is configured to inject testing signals into the testing channel at a second frequency that is greater than the first frequency. The system further includes at least one apparatus magnetically coupled to the at least one electric power transmission channel. The at least one magnetically coupled apparatus is configured to present a first impedance to the electric power at the first frequency and present a second impedance to the test signals at the second frequency. The second impedance is greater than the first impedance.

In a further aspect, an electrical system is provided. The electrical system includes an operating electrical device that includes at least one portion to be tested. The electrical system also includes at least one electric power transmission channel coupled to the operating electrical device and an electric power source. The at least one electric power transmission channel is configured to transmit electric power at a first frequency and a first voltage. The electrical system further includes a monitoring system that includes a testing channel coupled to the portion of the operating electrical device to be tested and the at least one electric power transmission channel. The monitoring system also includes a signal generator coupled to the testing channel. The signal generator is configured to inject testing signals into the testing channel at a second frequency that is greater than the first frequency. The monitoring system further includes at least one apparatus magnetically coupled to the at least one electric power transmission channel. The at least one magnetically coupled apparatus is configured to present a first impedance to the electric power at the first frequency and present a second impedance to the test signals at the second frequency. The second impedance is greater than the first impedance.

In another aspect, a method of testing insulation of an energized electrical device is provided. The method includes injecting a test signal into an electric power transmission channel that is coupled to an electric power source and the energized electrical device. The method also includes transmitting a substantial portion of the test signal toward the energized electrical device. The method further includes increasing an inductance of a first portion of the electric power transmission channel by inducing a reflected inductance on the first portion of the electric power transmission channel.

DRAWINGS

These and other features, aspects, and advantages of the present invention will become better understood when the following detailed description is read with reference to the accompanying drawings in which like characters represent like parts throughout the drawings, wherein.

Unless otherwise indicated, the drawings provided herein are meant to illustrate key inventive features of the invention. These key inventive features are believed to be applicable in a wide variety of systems comprising one or more embodiments of the invention. As such, the drawings are not meant to include all conventional features known by those of ordinary skill in the art to be required for the practice of the invention.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

As used herein, the terms "on-line", "in service", "in operation", and "energized" are used herein to describe a piece of equipment that is coupled to an electrical power source and is in a condition that would be understood by an operator of such equipment to be in operational service, either performing, or ready to perform, its intended functions.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged. Such ranges are identified and include all the sub-ranges contained therein unless context or language indicates otherwise.

Figure 1:
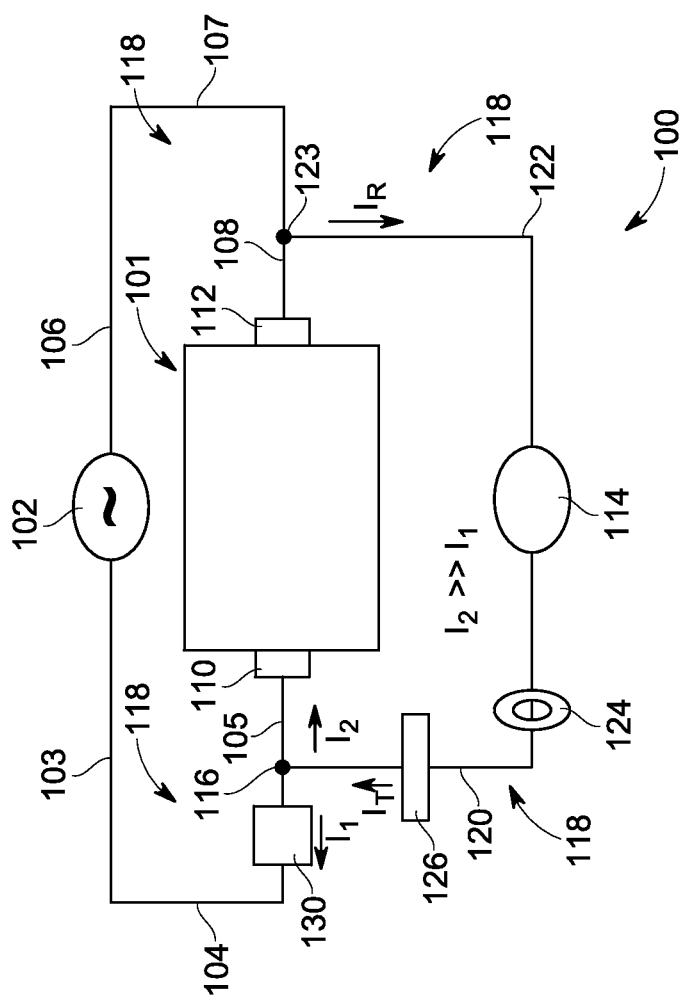
FIG. 1 is a schematic view of an exemplary on-line monitoring system for electrical assets.

FIG. 1 is a schematic view of an exemplary on-line monitoring system 100 for an electrical asset 101. In the exemplary embodiment, electrical asset 101 is any electrical device that includes electrical insulation between energized portions (not shown in FIG. 1) and portions at ground potential (not shown in FIG. 1). Such electrical devices include, without limitation, motors, generators, transformers, and power cables. Electrical asset 101 is coupled to an electric power source 102 that is, without limitation, a high voltage, e.g., greater than 1000 volts, and low frequency, i.e., either 50 Hertz (Hz) or 60 Hz, alternating current (AC) source. Electric power source 102 is coupled to at least one electric power transmission line channel 103 and a neutral channel 106. Alternatively, electric power source 102 transmits electric power with any frequency and any voltage that enables operation of on-line monitoring system 100 as described herein. Electrical asset 101 is coupled to line channel 103 through line terminals 110 (only one shown) and is coupled to neutral channel 106 through neutral terminals 112 (only one shown).

Also, in the exemplary embodiment, on-line monitoring system 100 includes a signal generator 114. Signal generator 114 generates low-voltage, high-frequency test signals. The generated signals have a voltage amplitude of less than 100 volts, and may be less than 5 volts. The generated signals also have a frequency above 1 kiloHertz (kHz), and may be greater than 1 MegaHertz (MHz). The generated signals further have a current amplitude of less than 1000 milliamperes (ma), and may be less than 10 ma. Alternatively, signal generator 114 generates test signals with any voltages, frequencies, and currents that enable operation of on-line monitoring system 100 as described herein. The test signals are embodied in a total test current $I_T$.

Further, in the exemplary embodiment, on-line monitoring system 100 includes a testing channel 118 that includes an injection portion 120 coupled to line channel 103 upstream of line terminals 110 at a test signal injection site 116. Injection portion 120 extends from signal generator 114 to test signal injection site 116. On-line monitoring system 100 also includes a radio frequency current transformer (RFCT) 124 coupled to injection portion 120 between signal generator 114 and line channel 103. RFCT 124 facilitates generating an accurate measurement of total test current $I_T$ transmitted through RFCT 124. On-line monitoring system 100 further includes a coupling capacitor 126 coupled to injection portion 120 between RFCT 124 and line channel 103. Coupling capacitor 126 facilitates blocking any DC components within total test current $I_T$ such that substantially only the AC components of total test current $I_T$ are injected into line channel 103. Coupling capacitor 126 has a capacitive value of approximately 10 nanoFarads (nF). Alternatively, coupling capacitor 126 has any capacitive value that enables operation of on-line monitoring system 100 as described herein.

Testing channel 118 also includes a recovery portion 122 coupled to neutral channel 106 upstream of neutral terminals 112 at a test signal recovery site 123. Recovery portion 122 extends from test signal recovery site 123 to signal generator 114.

Test signal injection site 116 divides line channel 103 into two portions. The first portion is a power source portion 104 extending from power source 102 to injection site 116 and the second portion is an asset portion 105 extending from injection site 116 to electrical asset 101. Testing channel 118 also includes asset portion 105.

Similarly, test signal recovery site 123 divides neutral channel 106 into two portions, i.e., a power source portion 107 extending from power source 102 to recovery site 123 and an asset portion 108 extending from recovery site 123 to electrical asset 101. Testing channel 118 further includes asset portion 108. Notably, neutral channel 106 is typically positioned close to the insulation (not shown) of electrical asset 101, and therefore also close to a ground potential.

Moreover, in the exemplary embodiment, on-line monitoring system 100 includes an inductive apparatus 130 magnetically coupled to power source portion 104. Inductive apparatus 130 is configured with a high impedance to the high frequency test signals within total test current $I_T$ and a low impedance to the low frequency electric power transmitted from electric power source 102 to electrical asset 101 through line channel 103. The high impedance to the high frequency test signals facilitates directing most of total test current $I_T$ toward the intended electrical asset 101 such that a first test current portion $I_1$ directed toward electric power source 102 through power source portion 104 is small as compared to a second test current portion $I_2$ directed toward electrical asset 101 through asset portion 105. Therefore, a signal strength of a test signal recovery current $I_R$ is increased to a sufficient signal strength to provide a reliable test result.

Figure 2:
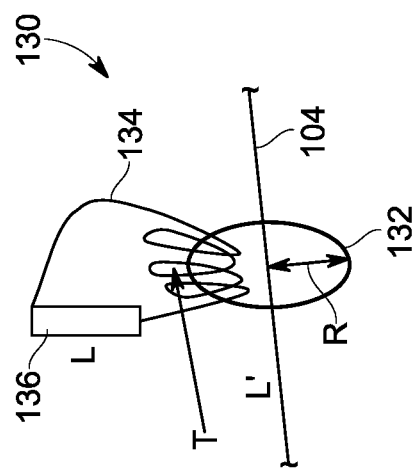
FIG. 2 is a schematic view of an exemplary high-impedance device that may be used with the on-line monitoring system shown in FIG. 1.

FIG. 2 is a schematic view of a high-impedance device, i.e., inductive apparatus 130 that may be used with on-line monitoring system 100 (shown in FIG. 1). Inductive apparatus 130 is magnetically-coupled to electric power transmission line channel 103, i.e., power source portion 104. Inductive apparatus 130 includes a first portion, i.e., a magnetic core 132. In the exemplary embodiment, magnetic core 132 is ring-shaped and extends around power source portion 104 to define a predetermined radial distance R between power source portion 104 and magnetic core 132 such that there is no physical contact between magnetic core 132 and power source portion 104. Magnetic core 132 is fabricated substantially from ferrite to attain the advantages of the associated high magnetic permeability and low electrical conductivity, thereby reducing a potential for inducing eddy currents within core 132. Alternatively, magnetic core 132 is fabricated from any magnetic materials, with any magnetic permeability and electrical conductance values, and in any shape that enable operation of inductive apparatus 130 and on-line monitoring system 100 as described herein.

Also, in the exemplary embodiment, inductive apparatus 130 includes a second portion, i.e., a coil 134. Coil 134 is fabricated from any electrically and magnetically conductive materials that enable operation of inductive apparatus 130 and on-line monitoring system 100 as described herein. Coil 134 includes turns T. Also, coil 134 has any number of turns T that enables operation of inductive apparatus 130 and on-line monitoring system 100 as described herein.

Further, in the exemplary embodiment, inductive apparatus 130 includes a third portion, i.e., an inductive device, i.e., inductor 136 that has an inductance value of L. Inductor 136 is fabricated substantially from ferrite. Alternatively, inductor 136 is fabricated from any materials with inductance values that enable operation of inductive apparatus 130 and on-line monitoring system 100 as described herein.

Figure 3:
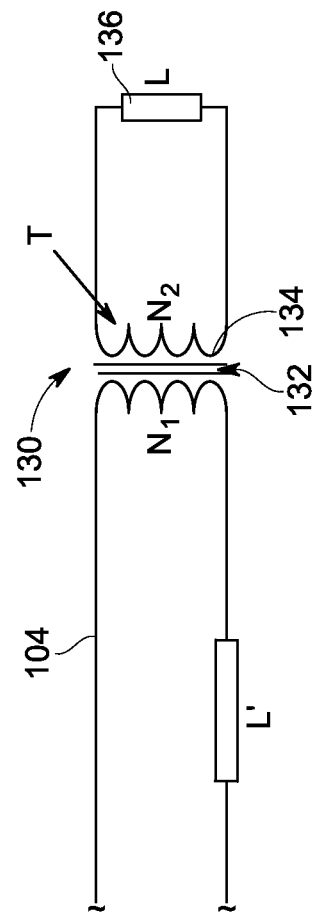
FIG. 3 is a schematic view of an exemplary reflected inductance that may be induced using the high-impedance device shown in FIG. 2.

FIG. 3 is a schematic view of an exemplary reflected inductance L' that may be induced using inductive apparatus 130. A value of reflected inductance L' is proportional to a value of the inductance L of inductor 136 and a ratio of the number $N_2$ of turns T of coil 134 to the number $N_1$ of turns of power source portion 104. $N_1$ has a value of one (1). Therefore, $L'=T*N_2$. Alternatively, $N_1$ has any value that enables operation of inductive apparatus 130 and on-line monitoring system 100 as described herein.

Referring to FIGS. 2 and 3, reflected inductance L' induces a low impedance to typical power frequencies, i.e., 50 Hz and 60 Hz. However, reflected inductance L' induces a high impedance to typical test signal frequencies, i.e., greater than 1 kHz.

Figure 4:
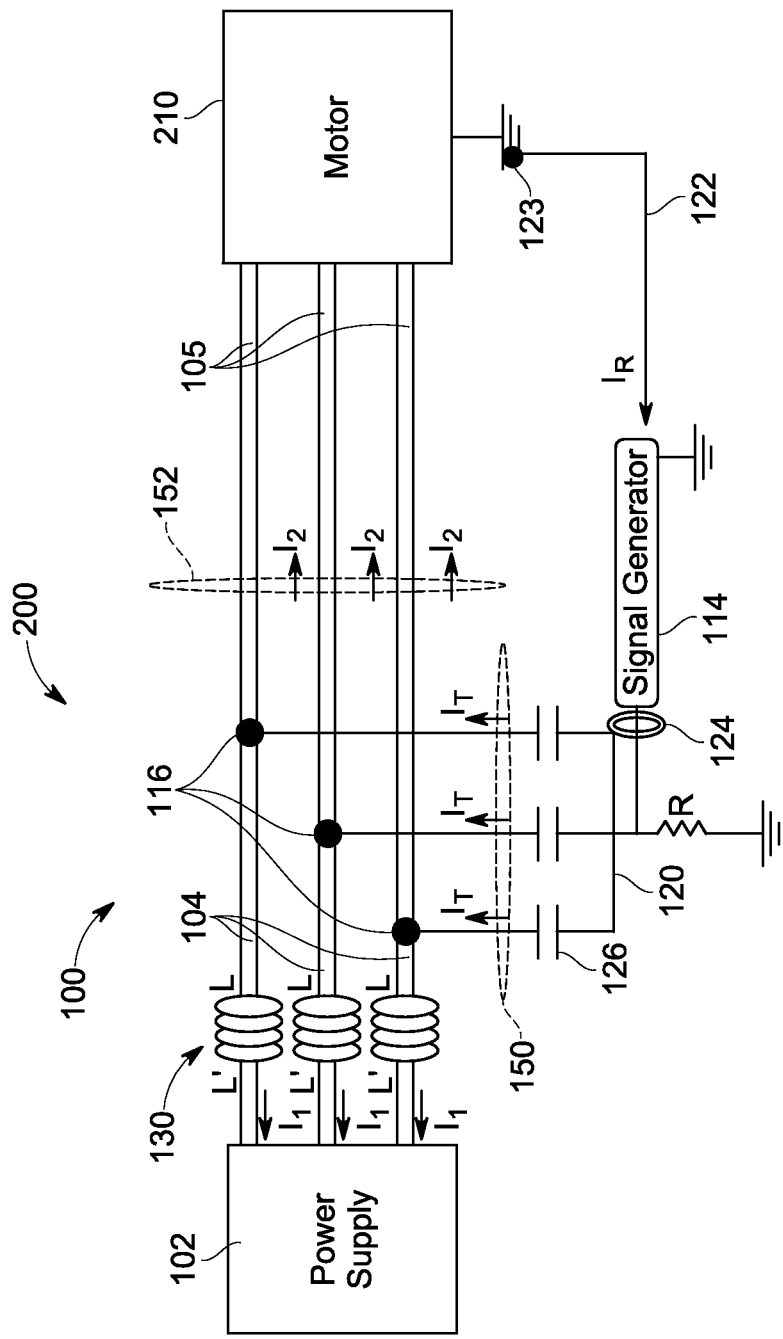
FIG. 4 is a schematic view of an exemplary electrical system with the on-line monitoring system shown in FIG. 1 implemented with a motor.

FIG. 4 is a schematic view of an exemplary electrical system 200 with on-line monitoring system 100 implemented with a motor 210. In the exemplary embodiment, electrical asset 101 (shown in FIG. 1) is motor 210. Electric power source 102, motor 210, and three of line channels 103 (shown FIG. 1), as defined by portions 104 and 105, define electrical system 200 as a three-phase system. Alternatively, on-line monitoring system 100 may be used with any number of electrical phases in any electrical system.

In operation, motor 140 is energized from electric power source 102 and electric power having a frequency of 50 Hz or 60 Hz is transmitted through line channels 103. Test signals 150 are generated by test signal generator 114 and are injected into each of line channels 103 with a total test current $I_T$ for each phase. Test signals 150 have a frequency of greater than 1 kHz. Therefore, the frequencies of test signals 150 are much greater in magnitude than the frequencies of the electric power. Each of inductive apparatus 130 is magnetically-coupled to the associated phase of line channels 103, i.e., power source portions 104 such that a reflected inductance L' is induced thereon. Such reflected inductance L' presents a first impedance to the electric power at the lower frequency and presents a second impedance to test signals 150 at the greater frequency. Since the second impedance is much greater than the first impedance, the electric power transmitted to motor 140 is substantially unaffected while a very small portion of total test current $I_T$, i.e., first portion of test current $I_1$, is transmitted toward power source 102 through power source portion 104. A significant portion 152 of test signals 150 in the form of second portion of test current $I_2$ is transmitted though asset portion 105 toward insulation (not shown) between energized windings (not shown) of motor 140 and ground potential. The resultant test signal recovery current $I_R$ is transmitted from motor 140 to signal generator 114 through recovery portion 122 for recording.

Figure 5:
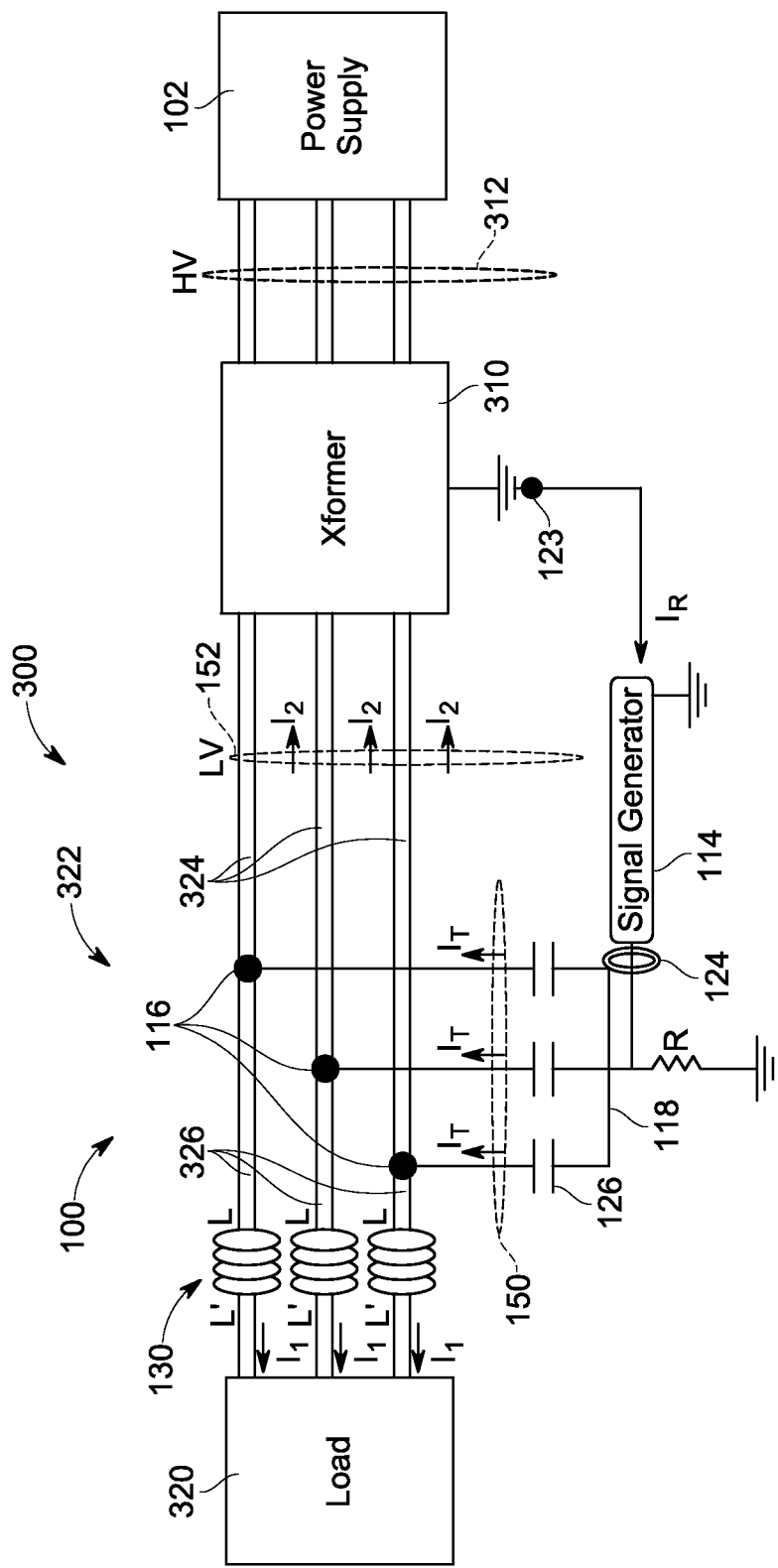
FIG. 5 is a schematic view of an exemplary electrical system with the on-line monitoring system shown in FIG. 1 implemented with a transformer.

FIG. 5 is a schematic view of an exemplary electrical system 300 with on-line monitoring system 100 implemented with a transformer 310. In the exemplary embodiment, electrical asset 101 (shown in FIG. 1) is transformer 310. Transformer 310 is coupled to electric power source 102 through a plurality of high-voltage channels 312. Transformer 160 is also coupled to a load 320 through a plurality of low-voltage channels 322 that each include a load portion 326 and a transformer portion 324. Electric power source 102, transformer 310, high-voltage channels 312, the three low-voltage channels 322, and load 320 define electrical system 300 as a three-phase system. Alternatively, on-line monitoring system 100 may be used with any number of electrical phases in any electrical system.

In the exemplary embodiment, inductive apparatus 130 are coupled to load portions 326 and testing channel 118 includes transformer portions 324. Load portions 326 and transformer portions 324 are at least partially defined by test signal injection sites 116.

Operation of on-line monitoring system 100 with transformer 310 is similar to that of motor 210 (shown in FIG. 4 and described above). In the exemplary embodiment, electric power is transmitted to load 320 through low-voltage channels 322 with a frequency of 50 Hz or 60 Hz. Test signals 150 are generated by test signal generator 114 and are injected into each of low-voltage channels 322 with a total test current $I_T$ for each phase. Test signals 150 have a frequency greater than 1 kHz. Therefore, the frequencies of test signals 150 are much greater in magnitude than the frequencies of the electric power. Each inductive apparatus 130 is magnetically-coupled to the associated phase of load portions 326 such that a reflected inductance L' is induced on each of load portions 326. Such reflected inductance L' presents a first impedance to the electric power at the lower frequency and presents a second impedance to test signals 150 at the much greater frequency. Since the second impedance is much greater than the first impedance, the electric power transmitted to load 210 is substantially unaffected while a very small portion of total test current $I_T$, i.e., first portion of test current $I_1$ is transmitted toward load 210 through load portions 326. A significant portion 152 of test signals 150 in the form of second portion of test current $I_2$ is transmitted through transformer portions 324 toward insulation (not shown) between energized windings (not shown) of transformer 310 and ground potential. Portion 152 of test signals 150 is transmitted in a direction opposite to that of electric power flow. The resultant test signal recovery current $I_R$ is transmitted from transformer 160 to signal generator 114 through recovery portion 122 for recording.

The above-described on-line monitoring system for electrical assets provides a cost-effective method for performing routine preventative maintenance and operation checks of on-line equipment, thereby increasing a reliability of electrical devices. The embodiments described herein facilitate directing transmission of test signals toward the objects to be tested rather than an electrical power source. Specifically, the devices, systems, and methods described herein facilitate increasing an inductance of the electric power transmission channel by inducing a reflected inductance thereon. More specifically, the devices, systems, and methods described herein include magnetically coupled, electrically non-contacting apparatus positioned between an injection site of the test signals into the electric power transmission channel and the electric power source. The devices, systems, and methods described herein increase an inductance of the electric power transmission channel with the induced and reflected inductance that presents a first impedance to the electric power at a first frequency and presenting a second impedance to the test signals at a second frequency, wherein the second frequency is greater than the first frequency and the second impedance is greater than the first impedance. Therefore, the devices, systems, and methods described herein facilitate transmitting a first test signal current away from the test object and a second test signal current toward the test object, wherein the second current is greater than the first current.

An exemplary technical effect of the methods, systems, and apparatus described herein includes at least one of: (a) increasing the signal strength of test signals transmitted toward a test object; (b) decreasing the signal strength of test signals transmitted toward an electric power source; and (c) performing (a) and (b) on on-line equipment without introducing a device into direct electrical contact with an electric power transmission channel.

Exemplary embodiments of monitoring systems for energized, on-line electrical equipment and methods for operating are described above in detail. The electrical equipment, monitoring systems, and methods of operating such systems and equipment are not limited to the specific embodiments described herein, but rather, components of systems and/or steps of the methods may be utilized independently and separately from other components and/or steps described herein. For example, the methods may also be used in combination with other systems requiring on-line monitoring and methods, and are not limited to practice with only the electrical equipment, monitoring systems, and methods as described herein. Rather, the exemplary embodiment can be implemented and utilized in connection with many other electrical applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system configured to monitor an operating electrical device that is coupled to an electric power source through at least one electric power transmission channel, the electric power source configured to transmit electric power at a first frequency and a first voltage, wherein the operating electrical device includes at least a portion to be tested, said system comprising:
    a testing channel configured to be coupled to the portion of the operating electrical device to be tested and the at least one electric power transmission channel, said testing channel comprising at least one of a test signal injection portion and a test signal recovery portion;
    a signal generator coupled to said testing channel, said signal generator configured to inject testing signals into said testing channel at a second frequency that is greater than the first frequency, said signal generator coupled to said testing channel through said at least one of said test signal injection portion and said test signal recovery portion; and
    at least one apparatus magnetically coupled to the at least one electric power transmission channel, wherein said at least one magnetically coupled apparatus is configured to induce a first impedance to the electric power at the first frequency and induce a second impedance to the test signals at the second frequency, wherein the second impedance is greater than the first impedance.

2. The system in accordance with claim 1, wherein said signal generator is further configured to inject the testing signals having a second voltage that is less than the first voltage.

3. The system in accordance with claim 1, wherein said at least one magnetically coupled apparatus comprises:
    a first magnetically coupled apparatus portion extending about the at least one electric power transmission channel, wherein said first magnetically coupled apparatus portion comprises a magnetic core;
    a second magnetically coupled apparatus portion coupled to said first magnetically coupled apparatus portion, said second magnetically coupled apparatus portion defining a plurality of turns about said first magnetically coupled apparatus portion; and
    a third magnetically coupled apparatus portion coupled to said second magnetically coupled apparatus portion, wherein said third magnetically coupled apparatus portion comprises an inductive device.

4. The system in accordance with claim 3, wherein said at least one magnetically coupled apparatus is configured to induce a reflected inductance on at least a portion of the at least one electric power transmission channel.

5. The system in accordance with claim 4, wherein a value of the reflected inductance is proportional to a value of an inductance of said third magnetically coupled apparatus portion and a ratio of the number of turns of said second magnetically coupled apparatus portion to a number of turns of the at least one electric power transmission channel.

6. The system in accordance with claim 5, wherein the number of turns of the at least one electric power transmission channel is one.

7. The system in accordance with claim 1, wherein said testing channel coupled to the at least one electric power transmission channel comprises a first portion of said testing channel coupled to a line power transmission channel and a second portion of said testing channel coupled to the operating electrical device.

8. The system in accordance with claim 1, wherein said testing channel is coupled to the at least one electric power transmission channel at a test signal injection site that defines a first portion of the at least one electric power transmission channel that receives said at least one magnetically coupled apparatus and a second portion of the at least one electric power transmission channel coupled to the electrical device to be tested.

9. An electrical system including an operating electrical device including at least one portion to be tested, said electrical system comprising:
    at least one electric power transmission channel coupled to the operating electrical device and an electric power source, wherein said at least one electric power transmission channel is configured to transmit electric power at a first frequency and a first voltage; and
    a monitoring system comprising:
        a testing channel coupled to said portion to be tested and said at least one electric power transmission channel, said testing channel comprising at least one of a test signal injection portion and a test signal recovery portion;
        a signal generator coupled to said testing channel, said signal generator configured to inject testing signals into said testing channel at a second frequency that is greater than the first frequency, said signal generator coupled to said testing channel through said at least one of said test signal injection portion and said test signal recovery portion; and at least one apparatus magnetically coupled to said at least one electric power transmission channel, wherein said at least one magnetically coupled apparatus is configured to induce a first impedance to the electric power at the first frequency and induce a second impedance to the test signals at the second frequency, wherein the second impedance is greater than the first impedance.

10. The electrical system in accordance with claim 9, wherein said signal generator is further configured to inject the testing signals having a second voltage that is less than the first voltage.

11. The electrical system in accordance with claim 9, wherein said at least one magnetically coupled apparatus comprises:

a first magnetically coupled apparatus portion extending about said at least one electric power transmission channel, wherein said first magnetically coupled apparatus portion comprises a magnetic core;

a second magnetically coupled apparatus portion coupled to said first magnetically coupled apparatus portion, said second magnetically coupled apparatus portion defining a plurality of turns about said first magnetically coupled apparatus portion; and a third magnetically coupled apparatus portion coupled to said second magnetically coupled apparatus portion, wherein said third magnetically coupled apparatus portion comprises an inductive device.

12. The electrical system in accordance with claim 11, wherein said at least one magnetically coupled apparatus is configured to induce a reflected inductance on at least a portion of said at least one electric power transmission channel.

13. The electrical system in accordance with claim 12, wherein a value of the reflected inductance is proportional to a value of an inductance of said third magnetically coupled apparatus portion and a ratio of the number of turns of said second magnetically coupled apparatus portion to a number of turns of said at least one electric power transmission channel.

14. The electrical system in accordance with claim 13, wherein the number of turns of said at least one electric power transmission channel is one.

15. The electrical system in accordance with claim 9, wherein said testing channel coupled to said at least one electric power transmission channel comprises a first portion of said testing channel coupled to a line power transmission channel and a second portion coupled to the operating electrical device.

16. The electrical system in accordance with claim 9, wherein said testing channel is coupled to said at least one electric power transmission channel at a test signal injection site that defines a first portion of said at least one electric power transmission channel that receives said at least one magnetically coupled apparatus and a second portion of said at least one electric power transmission channel coupled to the operating electrical device.

17. A method of testing insulation of an energized electrical device, said method comprising:

transmitting electric power into an electric power transmission channel at a first frequency, the electric power transmission channel coupled to an electric power source and the energized electrical device;

injecting a test signal at a second frequency that is greater than the first frequency through a test signal injection portion of a testing channel into the electric power transmission channel; and transmitting a substantial portion of the test signal toward the energized electrical device comprising inducing a first impedance to the electric power at the first frequency and inducing a second impedance to the test signal at the second frequency, wherein the second impedance is greater than the first impedance.

18. The method in accordance with claim 17, wherein inducing a first impedance to the electric power at the first frequency and inducing a second impedance to the test signal at the second frequency comprises:

transmitting a first test signal current through the first portion of the electric power transmission channel; and transmitting a second test signal current through a second portion of the electric power transmission channel, wherein the second current is greater than the first current.

19. The method in accordance with claim 17, wherein transmitting a substantial portion of the test signal toward the energized electrical device further comprises increasing an inductance of a first portion of the electric power transmission channel by inducing a reflected inductance on the first portion of the electric power transmission channel.

\* \* \* \* \*